(12) United States Patent
Perry

(10) Patent No.: US 7,800,377 B2
(45) Date of Patent: Sep. 21, 2010

(54) APPARATUS AND METHOD FOR CURRENT TRANSFORMER ADAPTATION

(75) Inventor: David Gareth Perry, Almonte (CA)

(73) Assignee: Triacta Power Technologies Inc, Almonte (CA)

( * ) Notice: Subject to any disclaimer, the term of this patent is extended or adjusted under 35 U.S.C. 154(b) by 280 days.

(21) Appl. No.: 12/137,505

(22) Filed: Jun. 11, 2008

(65) Prior Publication Data

US 2009/0309572 A1 Dec. 17, 2009

(51) Int. Cl.
*G01R 31/06* (2006.01)
(52) U.S. Cl. .................... 324/546; 324/127; 324/117 R
(58) Field of Classification Search .................. 324/72, 324/546, 127, 117 R
See application file for complete search history.

(56) References Cited

U.S. PATENT DOCUMENTS 4,513,274 A * 4/1985 Halder ....................... 336/173
6,590,390 B2 * 7/2003 Smith et al. ................. 324/252

OTHER PUBLICATIONS

"App Note: Using the WattNode with 5 Amp Output CTs"; Continental Control Systems, LLC; Boulder, CO, Feb. 1, 1999.
Specification Sheet for "MCTZ-3 Three Phase Current Transformer", ELKOR Technologies Inc., www.elkor.net, Sep. 3, 2008.

* cited by examiner

*Primary Examiner*—Vincent Q. Nguyen
(74) *Attorney, Agent, or Firm*—Mark Sprigings; Gowling, Lafleur Henderson LLP

(57) ABSTRACT

An apparatus and method for current transformer adaptation for extending a distance between a current sensing location, having a load current carrying load conductor, and a current measuring location having a measuring instrument. A first current transformer adapted to being connected to the load conductor is used to sense the load current. Typically the distanced between the first current transformer and the current measuring instrument is limited by a load burden rating of the first current transformer and a pre-determined resistive load per unit length of an instrument conductor connecting the first current transformer and the current measuring instrument. The present invention provides for the distance to be extended by connecting a second current transformer, having greater load burden rating than the first current transformer, to a secondary winding of the first current transformer and connecting the instrument conductor between the second current transformer and the current measuring instrument.

10 Claims, 4 Drawing Sheets

APPARATUS AND METHOD FOR CURRENT TRANSFORMER ADAPTATION

CROSS-REFERENCE TO RELATED APPLICATIONS

None.

FIELD OF INVENTION

The present invention relates to the field of current transformers used for measurement and instrumentation. In particular, to an apparatus and a method for current transformer adaptation for extending the distance between a current sensing location and a current measuring location.

BACKGROUND

Current transformers (CT) are instrument transformers that are used to supply a reduced value of current to measurement instruments (e.g. meters). CT provide isolation from a high voltage primary circuit, permit grounding of a secondary circuit, and step-down the magnitude of the measured current to a value that can be safely handled by the measurement instrument.

The most common CT secondary full-load current is 5 A, matching the typical standard 5 A full-scale current rating of traditional power metering equipment that are CT driven.

A typical design for a CT consists of a length of wire wrapped many times around a ferrous core (e.g. a steel ring) that is passed over the circuit being measured. The CT primary circuit consists of a single turn of conductor (i.e. the conductor being measured) and the secondary circuit consists of multiple turns.

Each CT has a current-ratio expressed as a ratio of the maximum rated primary current to the maximum rated secondary current. For example, a 300:5 CT will produce 5 A of secondary current when 300 A flows through the primary. As the primary current changes the secondary current varies accordingly. When 150 A flow through the 300 A-rated primary, the secondary current is 2.5 A. When the current through the primary exceeds the rated maximum, the current in the secondary will increase but will not, in general, be in proportion in accordance with the current ratio.

CT are defined by Accuracy Classes depending on their intended application. For applications such as, for example, metering for revenue billing, metering accuracy CT in accordance with, for example, American National Standard Institute (ANSI) C57.13 or International Electrotechnical Commission (IEC) 44-1 are used.

With the rising cost of energy and the growing concern over environmental impact, there is a desire to increase efforts directed toward reducing energy consumption. In the case of alternating current (AC) electrical power, consumption has traditionally been measured on an aggregated basis using, for example, one meter per home or per building. Conservation efforts are more effective when consumption can be measured on a more granular basis such as, for example, on a per household (e.g. in the case of a multi-residence building) or per circuit basis. Mechanisms directed to more granular measure are sometimes referred to as sub-metering.

In sub-metering applications, for example, it is often desirable to introduce metering points for multiple clients in an arrangement known as multi-customer meter systems (MCMS). The MCMS can include multiple metering points within a single enclosure and/or metering points that are distributed through a building or complex.

FIG. 1 is a schematic representation of a typical current transformer based metering arrangement. In a typical metering application a CT 110 is applied to each circuit 950, between an AC source 910 and a load 920, for which individual consumption measurements are desired. Traditional CT 110 are used to both sense current flowing in the circuit 950 and to step down the measured current as direct measurement of large currents is generally not desirable. The stepped down current is sensed across a precision resistor (not illustrated) within a measuring instrument 940 wherein the voltage drop (i.e. potential difference) across the resistor is directly proportional with the measured current. Within the measuring instrument 940 the measured voltage drop can be digitized and input to a digital signal processor (DSP) that can apply a ratio multiplier, based on the characteristics of the CT 110 to generate a current measurement. The measured current can then be multiplied by the voltage drop measured across load 920 to derive a power consumption measurement.

In a traditional metering application a measured current of 100 Amperes (A) or more is stepped down to a measurement current of not more than a threshold level such as, for example, up to 5 A, 10 A or 20 A by the CT. These CT are referred to as Ampere output CT. The CT is typically a toroidal transformer with the circuit to be measured passing through an aperture in the toroidal core of the CT. The current in the circuit being measured is referred to as the primary current. A winding around the toroidal core (a.k.a. the secondary circuit) generates an output current (a.k.a. a secondary current) that is proportional to the primary current. The proportion (i.e. ratio) of the primary current to the secondary current is a function of the ratio of the number of turns in the transformer windings that is referred to as the turns-ratio or the current-ratio.

The Ampere output CT have a relatively lower burden rating (i.e. the load resistance that the secondary current can drive while remaining within the specified accuracy of the CT) such as, for example, 0.2 ohms for a 5 A CT. The low burden rating requires that the measurement instrument 940 be located relatively close to the CT 110 (e.g. within approximately 20 feet). Although the use of larger gauge (e.g. larger than 16 American wire gauge (AWG)) wire to connect the CT 110 to the measuring instrument 940 permits the distance to be increased, this solution is costly and increasingly impractical as the wire gauge size and/or the distance increases. The secondary current (e.g. up to 5 A) of the Ampere output CT also results in relatively higher heat dissipation in the measuring instrument.

Recent measuring instruments are designed to operate with lower input currents typically on the order of up to 40 milliamperes (mA) or 80 mA and therefore are typically used with CT that have correspondingly lower secondary currents. These CT are referred to as mA output CT.

The mA output CT have a relatively higher burden rating such as, for example, 15 ohms for a 80 mA CT, that permits a relatively greater distance between the CT 110 and the measurement instrument 940. However, mA output CT are not readily available for primary currents greater than 200 A. Therefore mA output CT typically cannot be used in high current (e.g. greater than 200 A) applications.

In addition, in most jurisdictions electrical current supply and instrumentation (i.e. measurement) is regulated by one or more regulatory bodies. The direct use of mA output CT for measuring load currents is not permitted in some jurisdiction as the only approved configurations call for the use of specified Ampere output CT. Where the use of Ampere output CT is dictated and a significant distance between the CT 110 and the measuring instrument 940 is desired, proposed solutions have comprised digitizing the secondary current of the CT proximate to the CT 110 and then transmitting the digitized signal via differential pairs, fiber optic cable, radio or other similar means to the distal measuring instrument 940. These solutions have proven unsatisfactory due to complexity, cost, and the need for a power source proximate the CT 110 in order to power the analog-to-digital converter.

What is needed is an apparatus and method for CT adaptation that provides for a measurement instrument to be located at a significant distance from a conductor carrying a load current to be measured.

SUMMARY OF INVENTION

An apparatus and method for current transformer adaptation for extending a distance between a current sensing location and a current measuring location. The current sensing location is proximate to a load conductor carrying a load current between an alternating current (AC) source and a load. A current measuring instrument is located proximate the current measuring location. A first current transformer adapted to being connected to the load conductor is used to sense the load current. Typically the distance between the first current transformer and the current measuring instrument is limited by a load burden rating of the first current transformer and a pre-determined resistive load per unit length of an instrument conductor connecting the first current transformer and the current measuring instrument. The apparatus and method of the present invention provide for the distance to be extended by connecting a second current transformer, having a greater load burden rating than the first current transformer, to a secondary winding of the first current transformer and connecting the instrument conductor between the second current transformer and the current measuring instrument.

The apparatus and method provide for a first current transformer to be installed on the load conductor such that the load conductor forms a primary winding of the first current transformer. The first current transformer has a first current ratio and a first load burden rating. A second current transformer is installed on a closed circuit formed by a secondary winding of the first current transformer and thereby forming a primary winding of the second current transformer. The secondary winding of the first current transformer can be arranged to form a single turn or alternatively a multiple turn primary winding of the second current transformer. The second current transformer has a second current ratio, and a second load burden rating that is greater than the first load burden rating of the first current transformer. A current measuring instrument for deriving a measured reference current value for a current flowing through a reference resistive load is situated proximate the current measuring location. An instrument conductor is connected to and forms a closed circuit between a secondary winding of the second current transformer and the reference resistive load. The instrument conductor has a conductor resistive load that is the multiplicative product of a length of the instrument conductor and a pre-determined resistive load per unit length of the instrument conductor. The length of the instrument conductor dictates the maximum distance between the current sensing location (i.e. where the first current transformer and the load conductor are located) and the current measuring location (i.e. where the current measuring instrument is located). The instrument conductor according to the apparatus and method can any length such that the arithmetic sum of the conductor resistive load and the reference resistive load is less than or equal to the second load burden rating. A measured value for the load current can be derived from the measured reference current value, the second current ratio, and the first current ratio.

In accordance with one aspect of the present invention, there is provided an apparatus for current transformer adaptation for extending the distance between a current sensing location, proximate to a load conductor carrying a load current between an alternating current source and a load, and a current measuring location having a current measuring instrument for deriving a measured reference current value for a current flowing through a reference resistive load, the apparatus comprising: a first current transformer, a second current transformer and an instrument conductor. The first current transformer having: a first primary winding formed by installation of the first current transformer on the load conductor wherein the load current flowing through the first primary winding is also referred to as a first primary current; a first secondary winding arranged to form a closed circuit in which a first secondary current is generated responsive to the first primary current; a first current ratio representing the ratio of the first primary current to the first secondary current; and a first load burden rating representing a maximum resistive load that can be driven by the first secondary winding while remaining within rated accuracy parameters of the first current transformer. The second current transformer having: a second primary winding formed by installation of the second current transformer on to the closed circuit formed by the first secondary winding of the first current transformer wherein the first secondary current flowing through the second primary winding is also referred to as a second primary current; a second secondary winding in which a second secondary current is generated responsive to the second primary current; a second current ratio representing the ratio of the second primary current to the second secondary current; and a second load burden rating representing a maximum resistive load that can be driven by the second secondary winding while remaining within rated accuracy parameters of the second current transformer, wherein the second load burden rating has a higher ohmic value relative to the first load burden rating. The instrument conductor connected to, and forming a closed circuit between, the second secondary winding and the reference resistive load, and having a conductor resistive load that is the product of a length of the instrument conductor and a pre-determined resistive load per unit length. Wherein the instrument conductor can be of any length less than or equal to a maximum instrument conductor length where the sum of the conductor resistive load and the reference resistive load is equal to the second load burden rating, and wherein a measured value for the load current can be derived from the measured reference current value, the second current ratio and the first current ratio.

In accordance with another aspect of the present invention, there is provided a method for current transformer adaptation for extending the distance between a current sensing location, proximate to a load conductor carrying a load current between an alternating current source and a load, and a current measuring location having a current measuring instrument and a reference resistive load, the method comprising the steps of: installing, proximate the current sensing location, a first current transformer; installing a second current transformer; connecting to the reference resistive load; deriving a reference current value; and deriving a measured value for the load current. The first current transformer having: a first primary winding formed by installation of the first current transformer on the load conductor wherein the load current flowing through the first primary winding is also referred to as a first primary current; a first secondary winding arranged to form a closed circuit in which a first secondary current is generated responsive to the first primary current; a first current ratio representing the ratio of the first primary current to the first secondary current; and a first load burden rating representing a maximum resistive load that can be driven by the first secondary winding while remaining within rated accuracy parameters of the first current transformer. The second current transformer having: a second primary winding formed by installation of the second current transformer on to the closed circuit formed by the first secondary winding of the first current transformer wherein the first secondary current flowing through the second primary winding is also referred to as a second primary current; a second secondary winding in which a second secondary current is generated responsive to the second primary current; a second current ratio representing the ratio of the second primary current to the second secondary current; and a second load burden rating representing a maximum resistive load that can be driven by the second secondary winding while remaining within rated accuracy parameters of the second current transformer, wherein the second load burden rating has a higher ohmic value relative to the first load burden rating. The second secondary winding is connected to the reference resistive load to form a closed circuit using an instrument conductor having a conductor resistive load that is the product of a length of the instrument conductor and a pre-determined resistive load per unit length. The measured reference current value for a current flowing through the reference resistive load is derived using the current measuring instrument. The measured value for the load current is derived from the measured reference current value, the second current ratio and the first current ratio; wherein the instrument conductor can be of any length less than or equal to a maximum instrument conductor length where the sum of the conductor resistive load and the reference resistive load is equal to the second load burden rating.

Other aspects and features of the present invention will become apparent to those ordinarily skilled in the art or science to which it pertains upon review of the following description of specific embodiments of the invention in conjunction with the accompanying figures.

BRIEF DESCRIPTION OF DRAWINGS

The present invention will be described in conjunction with drawings in which.

DETAILED DESCRIPTION

Figure 1:
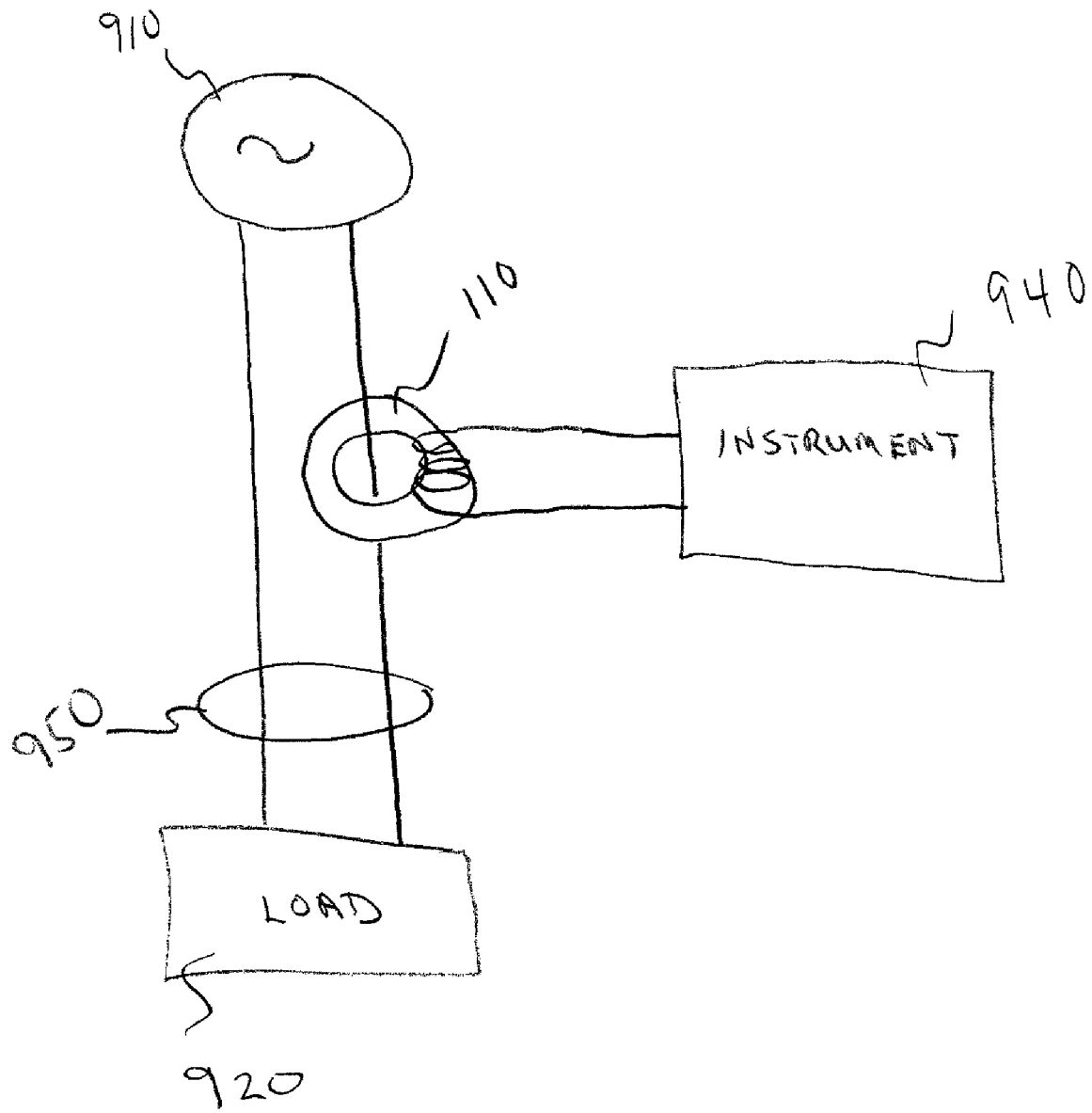
FIG. 1 is a schematic representation of a typical current transform based metering arrangement.
Figure 2:
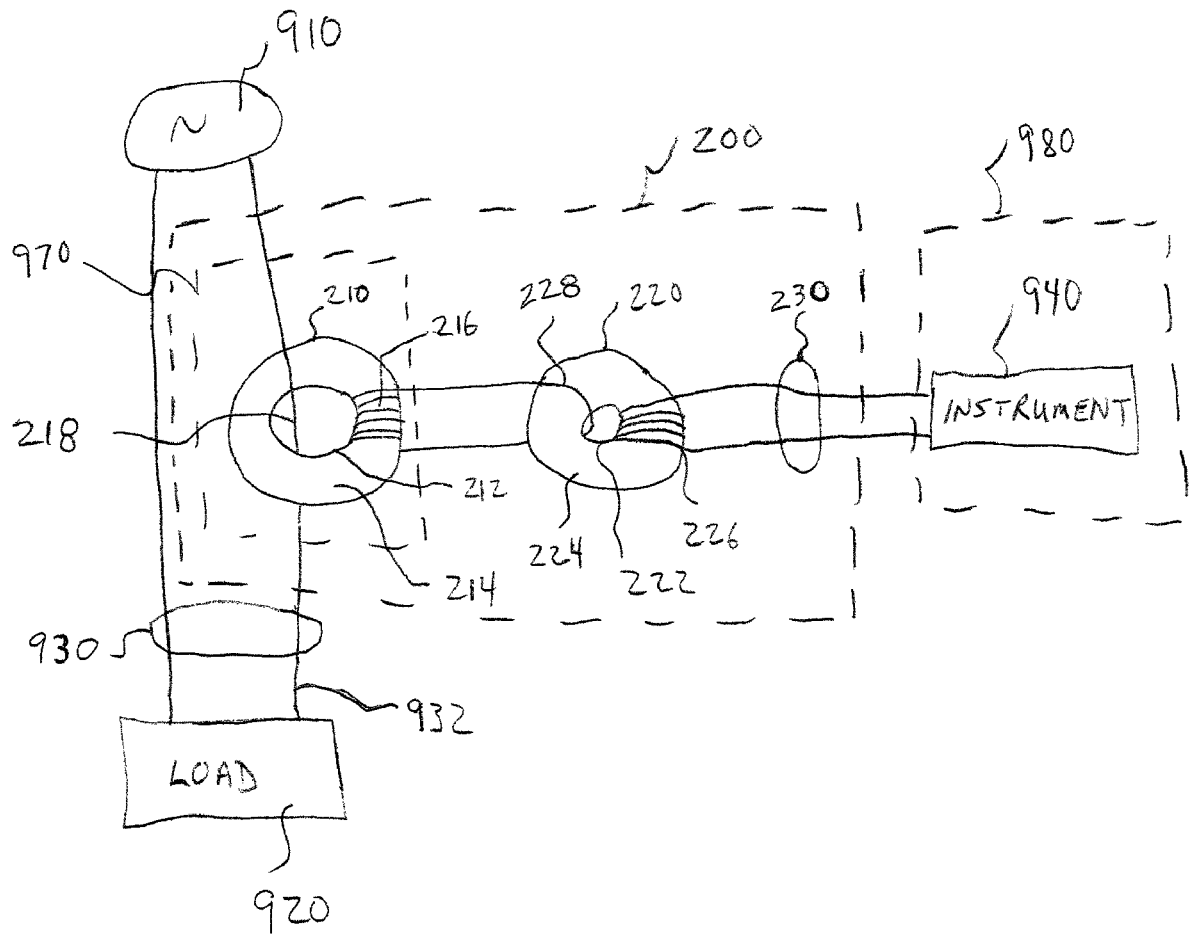
FIG. 2 is a schematic representation of an exemplary embodiment of an apparatus for current transformer adaptation in an exemplary environment in which it can be used.

FIG. 2 is a schematic representation of an exemplary apparatus 200 for current transformer adaptation for extending a distance between a current sensing location 970 and a current measuring location 980 in an exemplary environment in which it can be used. The environment comprises an alternating current (AC) power source 910, a load 920 connected to the power source 910 via a conductor 930, and a measurement instrument 940. The apparatus 200 is comprised of a first current transformer (CT) 210, a second CT 220 and an instrument conductor 230. The first CT 210 is arranged to sense the current flowing between the source 910 and the load 920 (i.e. the load current) at the current sensing location 970. Conductor 930 comprises two or more wires. One wire 932 of conductor 930 is arranged to penetrate an aperture 212 in a core 214 of first CT 210 and thereby form a primary winding 218 of first CT 210. First CT 210 further comprises a secondary winding 216.

The first CT 210 is characterized by a current-ratio and a load burden rating. The first CT 210 is arranged to sense a current (typically 200 A or more) between the source 910 and the load 920 (i.e. the load current). The output current of the secondary winding 216 of the first CT 210 is responsive to the load current and can range up to the ampere level (e.g. up to: 5 A, 10 A, or 20 A) as a function of the particular CT chosen. The relationship of the output current to the load current is a function of the current-ratio of first CT 210. The current-ratio can be expressed as the ratio of a maximum primary current rating to a maximum output current rating. The current-ratio is a function of the number of turns in the primary winding (i.e. circuit) 218 to the number of turns in the secondary winding (i.e. circuit) 216 of the current transformer. The number of turns in the primary winding 218 of the first CT 210 is typically one (1) as the wire 932 does not lend itself to creating multiple turns. The load burden rating represents a maximum resistive load that can be driven by the secondary winding 216 of the first CT 210 while remaining within rated accuracy parameters of the first CT 210.

The second CT 220 is arranged to sense the current flowing in the secondary winding 216 of first CT 210 (i.e. the secondary current). The secondary winding 216 of the first CT 210 is arranged to form a closed circuit that penetrates an aperture 222 in a core 224 of the second CT 220 and thereby form a primary winding 228 of the second CT 220. The second CT 220 further comprises a secondary winding 226.

The second CT 220 is characterized by a current-ratio and a load burden rating. The second CT 220 is arranged to sense a current (preferably 20 A or less) in a closed circuit formed by the secondary winding 216 of the first CT 210 (i.e. the primary current of the second CT 220). A secondary current in the secondary winding 226 of the second CT 220 is responsive to the primary current and can, for example, range up to the milliampere level (e.g. up to 80 mA) as a function of the particular CT chosen. The relationship of the secondary current to the primary current is a function of the current-ratio of second CT 220. The current-ratio can be expressed as the ratio of a maximum primary current rating to a maximum secondary current rating. The current-ratio is a function of the number of turns in the primary winding (i.e. circuit) to the number of turns in the secondary winding (i.e. circuit) of the current transformer. The load burden rating represents a maximum resistive load that can be driven by the secondary winding of the secondary CT 220 while remaining within rated accuracy parameters of the secondary CT 220.

The secondary winding 226 of the second CT 220 is connected to the instrument 940 via the instrument conductor 230. The instrument conductor 230 comprises two wires, each wire preferably being 16 American wire gauge (AWG) or smaller in gauge. The instrument 940 can derive a measurement of the secondary current of the second CT 220 from a voltage drop (i.e. potential difference) measured across a reference resistive load. The reference resistive load can be internal to the instrument 940 or alternatively be external to the instrument 940. A value for the load current can be derived from the multiplicative product of the current flowing in the reference resistive load, the current-ratio of the second CT 220 and the current-ratio of the first CT 210.

In an illustrative example the load current can be up to 600 A, the current-ratio of the first CT 210 is arranged to generate an output current up to 5 A responsive to the load current (i.e. 600:5), the current-ratio of the second CT 220 is arranged to generate an output current up to 80 mA responsive to the output current of the first CT 210 (i.e. 5:0.080), and the instrument 940 is adapted to receiving an measurement current (i.e. the output current of the second CT 220) of up to 80 mA. The burden rating of the second CT 220 has a value of 15 ohms. The internal resistance (i.e. the reference resistive load) of the instrument 940 is 4 ohms. The instrument conductor 230 comprises two 18 AWG wires each having a resistance of 0.0064 ohms/ft. Based on this illustrative example, the maximum usable length for the instrument conductor 230 can be calculated as: (15-4) ohms/(2×0.0064 ohms/ft)=860 ft. Therefore, in this example, the apparatus 200 allows the instrument 940 to be located up to 860 ft from the second CT 220 when sensing a load current up to 600 A and while remaining within the pre-determined thresholds for accurate operation of the first CT 210 and the second CT 220.

The characteristics of the first CT 210 can be selected so that the first CT 210 conforms to applicable regulation (e.g. a requirement that the first CT 210 be of a type having an output current of up to 5 A) and the characteristics of second CT 220 can be selected to be compatible with the secondary winding of the first CT 210 and to maximize the load burden rating of second CT 220 while generating a secondary current that is compatible with the measuring instrument 940. In an exemplary embodiment, the second CT 220 is adapted to have a current ratio such that when the primary current of the second CT 220 is equal to the maximum output (i.e. secondary) current of the first CT 210 (e.g. 5 A), then the output (i.e. secondary) current of the second CT 220 is substantially equal to the maximum input current rating (e.g. 80 mA) of the measuring instrument 940. By maximizing the load burden rating of the second CT 220, the potential maximum length of the instrument conductor 230 is also maximized. The load burden rating of the second CT 220 is preferably greater than (i.e. having a higher ohmic value) than the load burden rating of the first CT 210.

Figure 4:
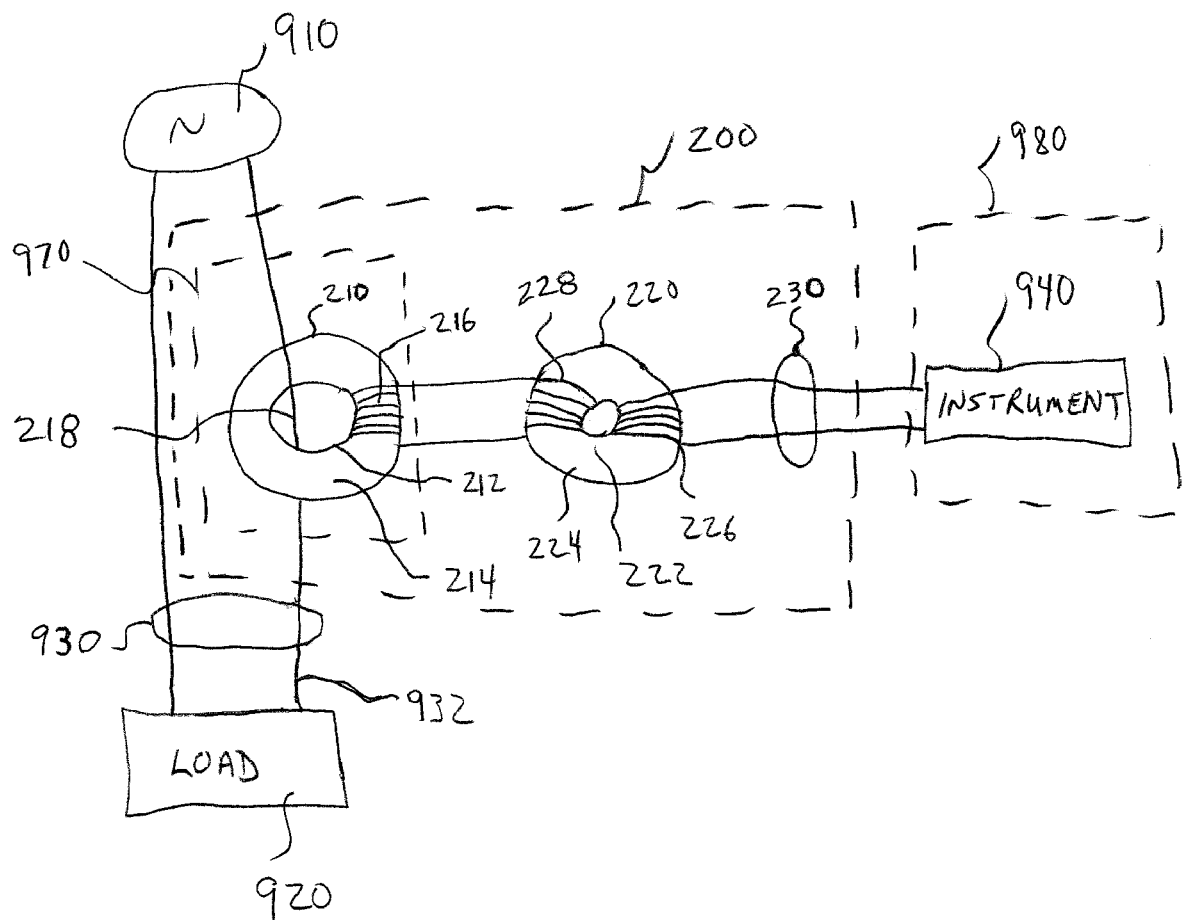
FIG. 4 is a schematic representation of an alternative exemplary embodiment of the apparatus for current transformer adaptation.

FIG. 4 is a schematic representation of an alternative exemplary embodiment of the apparatus 200. In the alternative embodiment, the second CT 220 is selected such that a maximum secondary current that can be generated, which is a function of the load burden rating, is less than, but substantially equal to, a maximum input rating of the instrument 940, and such that a specified current-ratio (i.e. a current-ratio based on a single turn primary winding) provides for the secondary current in the second CT 220 to be less than the maximum secondary current when a primary current in the second CT 220 is equal to a maximum secondary current generated by the first CT 210. The specified current-ratio is based on a single turn in the primary winding of the second CT 220. In the alternative embodiment the second CT 220 is arranged so that the closed circuit formed by the secondary winding 216 of the first CT 210 forms a multiple turn primary winding 400 of the second CT 220. The number of turns in the primary winding 400 of the second CT 220 is derived as a function of the maximum secondary current of the first CT 210, the specified current-ratio of the second CT 220 and maximum secondary current of the second CT 220. In an illustrative example, the first CT 210 has a maximum secondary current of 5 A, the second CT 220 has a specified current-ratio of 200 A:80 mA, and the maximum secondary current of the second CT 220 is 80 mA. By arranging the closed circuit formed by the secondary winding 216 of the first CT 210 to form forty (40) turns in the primary winding 400 of the second CT 220, the second CT 220 is adapted to give an adapted current-ratio of 5 A:80 mA (i.e. 200 A/40:80 mA).

Figure 3:
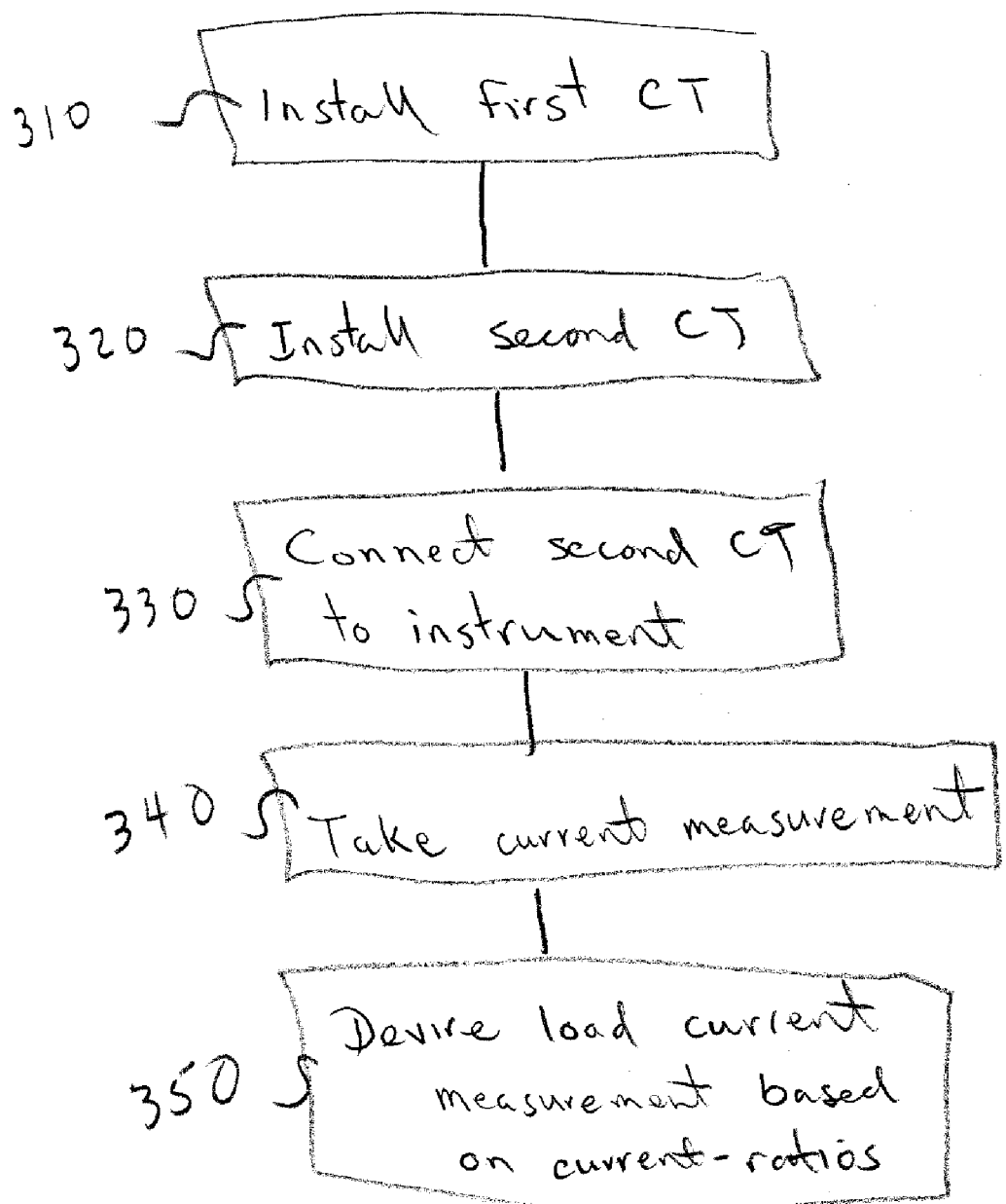
FIG. 3 is a flow diagram representing the steps in an exemplary method for current transformer adaptation.

FIG. 3 is a flow diagram representing the steps in an exemplary method 300 for current transformer adaptation. The method 300 can be implemented using, for example the apparatus 200 described above with reference to FIGS. 2 and 4. The method 300 is used for measuring the load current flowing in a conductor 930 connecting an AC power source 910 to a load 920. In step 310 a first CT 210 is installed at the current sensing location 970 to sense the load current by arranging a wire 932 in the conductor 930 as the primary winding 218 of the first CT 210. The first CT 210 is adapted to sensing the load current (e.g. 100 A or more) and in response generating on output current (e.g. 20 A or less). The specifications and characteristics of the first CT 210 can be dictated by jurisdictional regulations or alternative can be a function of the commercially available CT that support the load current in an application. In step 320 a second CT 220 is installed and arranged such that a closed circuit formed by the secondary (i.e. output) circuit of the first CT 210 forms the primary winding of the second CT 220. The closed circuit formed by the secondary circuit of the first CT 210 can be arranged to form a single turn primary winding of the second CT 220 or alternatively can be arranged to form a multiple turn primary winding of the second CT 220. The second CT 220 is adapted to sensing a primary current (e.g. 20 A or less) and in response generating on output current (e.g. 100 mA or less). The specifications and characteristics of the second CT 220 are selected to ensure that the output current of the second CT 220 is compatible with the measuring instrument 940 and to maximize a load burden rating of second CT 220. The closed circuit formed by the secondary winding 216 of the first CT 210 is arranged to form a single turn primary winding 228 of the second CT 220 when the specifications and characteristics of the second CT 220 are further selected such that when the primary current of the second CT 220 is substantially equal to the maximum output (i.e. secondary) current of the first CT 210 (e.g. 5 A), then the output (i.e. secondary) current of the second CT 220 is substantially equal to the maximum input current rating (e.g. 80 mA) of the measuring instrument 940. In an alternative embodiment, the specifications and characteristics of the second CT 220 are further selected such that a specified current-ratio provides for the secondary current in the second CT 220 to be less than a maximum secondary current rating when a primary current in the second CT 220 is equal to a maximum secondary current rating by the first CT 210. In the alternative embodiment the second CT 220 is arranged so that the closed circuit formed by the secondary winding 216 of the first CT 210 forms a multiple turn primary winding 228 of the second CT 220. The number of turns in the primary winding 228 of the second CT 220 is derived as a function of the maximum secondary current of the first CT 210, the specified current-ratio of the second CT 220 and maximum secondary current of the second CT 220. In step 330 the output circuit (i.e. the secondary winding 226) of the second CT 220 is connected via a two-wire instrument conductor 230 to the measuring instrument 940 located at the current measuring location 980. The wires are preferably relatively small gauge wires (e.g. 16 AWG or smaller). The maximum operable length of the conductor can be calculated as described above with reference to apparatus 200 and FIG. 2. In step 340 the measuring instrument derives a measurement for the output current presented by the second CT 220 from a voltage drop across a reference resistive load. In step 350, a measurement for the load current can be derived as a function of the measurement made in step 340 and the current-ratios of the first CT 210 and the second CT 220. The current ratio of the second CT 220 is alternatively the specified current ratio in an arrangement having a single turn primary winding 228, or in an arrangement having a multiple turn primary winding 228 the current ratio is an adapted current ratio as described above with reference to apparatus 200 and FIG. 4.

It will be apparent to one skilled in the art that numerous modifications and departures from the specific embodiments described herein may be made without departing from the spirit and scope of the present invention.

The invention claimed is:

1. An apparatus for current transformer adaptation for extending the distance between a current sensing location, proximate to a load conductor carrying a load current between an alternating current source and a load, and a current measuring location having a current measuring instrument for deriving a measured reference current value for a current flowing through a reference resistive load, the apparatus comprising:
 a first current transformer having:
  a first primary winding formed by installation of the first current transformer on the load conductor wherein the load current flowing through the first primary winding is also referred to as a first primary current;
  a first secondary winding arranged to form a closed circuit in which a first secondary current is generated responsive to the first primary current;
  a first current ratio representing the ratio of the first primary current to the first secondary current; and
  a first load burden rating representing a maximum resistive load that can be driven by the first secondary winding while remaining within rated accuracy parameters of the first current transformer;
 a second current transformer having:
  a second primary winding formed by installation of the second current transformer on to the closed circuit formed by the first secondary winding of the first current transformer wherein the first secondary current flowing through the second primary winding is also referred to as a second primary current;
  a second secondary winding in which a second secondary current is generated responsive to the second primary current;
  a second current ratio representing the ratio of the second primary current to the second secondary current; and
  a second load burden rating representing a maximum resistive load that can be driven by the second secondary winding while remaining within rated accuracy parameters of the second current transformer, wherein the second load burden rating has a higher ohmic value relative to the first load burden rating; and
 an instrument conductor connected to, and forming a closed circuit between, the second secondary winding and the reference resistive load, and having a conductor resistive load that is the product of a length of the instrument conductor and a pre-determined resistive load per unit length;
 wherein the instrument conductor can be of any length less than or equal to a maximum instrument conductor length where the sum of the conductor resistive load and the reference resistive load is equal to the second load burden rating, and wherein a measured value for the load current can be derived from the measured reference current value, the second current ratio and the first current ratio.

2. The apparatus of claim 1, wherein the first current ratio of the first current transformer is pre-determined responsive to applicable jurisdictional regulations.

3. The apparatus of claim 1, wherein the first current transformer has a maximum rated secondary current of five amperes.

4. The apparatus of claim 1, wherein the second primary winding comprises a single turn of the first secondary winding, and the second current ratio is a specified current ratio for the second current transformer.

5. The apparatus of claim 1, wherein the second primary winding comprises a plurality of turns of the first secondary winding, and the second current ratio is an adapted current ratio derived from a number of turns in the second primary winding and a number of turns in the second secondary winding.

6. A method for current transformer adaptation for extending the distance between a current sensing location, proximate to a load conductor carrying a load current between an alternating current source and a load, and a current measuring location having a current measuring instrument and a reference resistive load, the apparatus comprising:
 installing, proximate the current sensing location, a first current transformer having:
  a first primary winding formed by installation of the first current transformer on the load conductor wherein the load current flowing through the first primary winding is also referred to as a first primary current;
  a first secondary winding arranged to form a closed circuit in which a first secondary current is generated responsive to the first primary current;
  a first current ratio representing the ratio of the first primary current to the first secondary current; and
  a first load burden rating representing a maximum resistive load that can be driven by the first secondary winding while remaining within rated accuracy parameters of the first current transformer;
 installing a second current transformer having:
  a second primary winding formed by installation of the second current transformer on to the closed circuit formed by the first secondary winding of the first current transformer wherein the first secondary current flowing through the second primary winding is also referred to as a second primary current;
  a second secondary winding in which a second secondary current is generated responsive to the second primary current;
  a second current ratio representing the ratio of the second primary current to the second secondary current; and
  a second load burden rating representing a maximum resistive load that can be driven by the second secondary winding while remaining within rated accuracy parameters of the second current transformer, wherein the second load burden rating has a higher ohmic value relative to the first load burden rating;
 connecting the second secondary winding to the reference resistive load to form a closed circuit using an instrument conductor having a conductor resistive load that is the product of a length of the instrument conductor and a pre-determined resistive load per unit length;
 deriving a measured reference current value for a current flowing through the reference resistive load using the current measuring instrument; and
 deriving a measured value for the load current from the measured reference current value, the second current ratio and the first current ratio;

wherein the instrument conductor can be of any length less than or equal to a maximum instrument conductor length where the sum of the conductor resistive load and the reference resistive load is equal to the second load burden rating.

7. The method of claim 6, wherein characteristics on the first current transformer are pre-determined as a function of applicable jurisdictional regulations.

8. The method of claim 6, wherein the first current transformer has a maximum rated secondary current of five amperes.

9. The method of claim 6, wherein the second primary winding comprises a single turn of the first secondary winding, and the second current ratio is a specified current ratio for the second current transformer.

10. The method of claim 6, wherein the second primary winding comprises a plurality of turns of the first secondary winding, and the second current ratio is an adapted current ratio derived from a number of turns in the second primary winding and a number of turns in the second secondary winding.

* * * * *